(12) United States Patent
Ikenoya et al.

(10) Patent No.: US 10,948,814 B2
(45) Date of Patent: *Mar. 16, 2021

(54) SUBSTRATE FOR USE AS MASK BLANK, AND MASK BLANK

(71) Applicant: AGC Inc., Chiyoda-ku (JP)

(72) Inventors: Nobuhiko Ikenoya, Tokyo (JP); Yusuke Hirabayashi, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 33 days.

This patent is subject to a terminal disclaimer.

(21) Appl. No.: 15/467,031

(22) Filed: Mar. 23, 2017

(65) Prior Publication Data
US 2017/0277034 A1 Sep. 28, 2017

(30) Foreign Application Priority Data

Mar. 23, 2016 (JP) .............................. JP2016-059047
Mar. 3, 2017 (JP) .............................. JP2017-041105

(51) Int. Cl.
*G03F 1/24* (2012.01)
*G03F 1/22* (2012.01)
*G03F 1/60* (2012.01)
*G03F 1/82* (2012.01)

(52) U.S. Cl.
CPC .................. *G03F 1/24* (2013.01); *G03F 1/22* (2013.01); *G03F 1/60* (2013.01); *G03F 1/82* (2013.01)

(58) Field of Classification Search
CPC ..... G03F 1/24; G03F 1/22; G03F 1/60; G03F 1/0092; G03F 1/14; G03F 1/82
See application file for complete search history.

(56) References Cited

U.S. PATENT DOCUMENTS

| 6,855,908 | B2 * | 2/2005 | Takeuchi | ................ C03C 15/00 219/121.4 |
| 7,592,104 | B2 | 9/2009 | Tanabe et al. | |
| 7,745,074 | B2 | 6/2010 | Tanabe et al. | |
| 7,892,708 | B2 | 2/2011 | Tanabe et al. | |
| 7,910,264 | B2 * | 3/2011 | Shoki | ..................... B82Y 10/00 430/5 |

(Continued)

FOREIGN PATENT DOCUMENTS

| JP | 4803576 | 10/2011 |
| JP | 5637062 | 12/2014 |

(Continued)

*Primary Examiner* — Martin J Angebranndt
(74) *Attorney, Agent, or Firm* — Oblon, McClelland, Maier & Neustadt, L.L.P.

(57) ABSTRACT

In a substrate for use as a mask blank including a first main surface, a normal region, a frame-shaped region and inner region are present on the first main surface. The frame-shaped region includes first to fourth corner region and first to fourth middle region. The inner region has a flatness of 100 nm or less, the flatness being determined on the basis of a least-squares plane $PP_1$ of the normal region. When one of the corner regions is referred to as an n-th corner region and two middle regions nearest to the n-th corner region are respectively referred to as a first near middle region and a second near middle region, the specific relationship regarding the surface profile is satisfied in the n-th corner region and the first and second near middle regions.

14 Claims, 6 Drawing Sheets

(56) References Cited

U.S. PATENT DOCUMENTS

| | | | |
|---|---|---|---|
| 9,684,232 B2* | 6/2017 | Hirabayashi | G03F 1/60 |
| 10,599,031 B2* | 3/2020 | Okamura | G03F 1/22 |
| 2002/0155361 A1* | 10/2002 | Takeuchi | C03C 15/00 |
| | | | 430/5 |
| 2004/0027555 A1* | 2/2004 | Hrdina | B82Y 10/00 |
| | | | 356/33 |
| 2004/0192171 A1* | 9/2004 | Koike | B24B 37/042 |
| | | | 451/5 |
| 2005/0032622 A1* | 2/2005 | Dawes | C03B 19/02 |
| | | | 501/54 |
| 2006/0068300 A1 | 3/2006 | Tanabe et al. | |
| 2007/0134566 A1* | 6/2007 | Maida | B82Y 10/00 |
| | | | 430/5 |
| 2009/0017257 A1* | 1/2009 | Otsuka | B24B 7/242 |
| | | | 428/141 |
| 2009/0143213 A1* | 6/2009 | Hrdina | C03B 19/1407 |
| | | | 501/53 |
| 2010/0035028 A1* | 2/2010 | Tanabe | G03F 1/60 |
| | | | 428/195.1 |
| 2010/0035164 A1* | 2/2010 | Tanabe | G03F 1/60 |
| | | | 430/5 |
| 2010/0080961 A1* | 4/2010 | Okamura | C03C 15/02 |
| | | | 428/192 |
| 2010/0248092 A1 | 9/2010 | Tanabe et al. | |
| 2011/0262846 A1* | 10/2011 | Tanabe | G03F 1/60 |
| | | | 430/5 |
| 2011/0287219 A1 | 11/2011 | Matsui et al. | |
| 2011/0318996 A1* | 12/2011 | Okafuji | B24B 7/241 |
| | | | 451/41 |
| 2012/0258389 A1* | 10/2012 | Maida | C03B 19/1415 |
| | | | 430/5 |
| 2014/0329174 A1* | 11/2014 | Hamamoto | G03F 1/22 |
| | | | 430/5 |
| 2015/0301442 A1 | 10/2015 | Kageyama et al. | |
| 2016/0041461 A1* | 2/2016 | Hirabayashi | C03C 15/00 |
| | | | 430/5 |
| 2016/0109797 A1* | 4/2016 | Tanabe | G03F 7/20 |
| | | | 430/5 |
| 2016/0161837 A1* | 6/2016 | Hamamoto | G03F 7/2004 |
| | | | 430/5 |

FOREIGN PATENT DOCUMENTS

| | | | | |
|---|---|---|---|---|
| JP | 2015-215602 A | 12/2015 | | |
| JP | 2016-38573 A | 3/2016 | | |
| WO | 2014/0203961 | * 12/2014 | | |
| WO | 2015/030159 | * 3/2015 | | G03F 1/24 |

* cited by examiner

SUBSTRATE FOR USE AS MASK BLANK, AND MASK BLANK

CROSS-REFERENCE TO RELATED APPLICATIONS

This application claims priority from Japanese Patent Application No. 2016-059047 on Mar. 23, 2016 and Japanese Patent Application No. 2017-041105 on Mar. 3, 2017, the entire subject matters of which are incorporated herein by reference.

BACKGROUND OF THE INVENTION

Technical Field

The present invention relates to a substrate for use as a mask blank and to a mask blank.

Background Art

In the field of semiconductor device production, a pattern transfer technology using exposure light and a mask is utilized when forming a pattern on a substrate to be processed, such as a silicon wafer.

In this pattern transfer technology, the pattern of a mask can be transferred to a surface of the substrate to be processed (usually, the surface of a resist) by irradiating the substrate with exposure light through the mask (hereinafter, this process is referred to also as "transfer process"). Thereafter, the resist is developed. As a result, the substrate to be processed can be made to have the resist which has a desired pattern.

In recent years, attention is in particular being focused on an ArF exposure technology in which ArF excimer laser light is used and on an EUV exposure technology in which EUV exposure light is used, in order to render micropattern transfer possible.

For example, EUV (extreme ultraviolet) light, which has wavelengths shorter than ArF excimer laser light, is used for the EUV exposure technology. The term "EUV light" herein means light which includes soft X-rays and vacuum ultraviolet light and which specifically has wavelengths of about 0.2 nm to 100 nm. At present, EUV light having a wavelength of about 13.5 nm is being mainly investigated as exposure light.

SUMMARY OF THE INVENTION

In the aforesaid transfer process, a mask is generally used in the state of having been attached (chucked) to the stage of an exposure apparatus such as a stepper.

However, it is often observed that the mask deforms when the mask is chucked to the stage.

There is a possibility that such a deformation of the mask might result in a decrease in the accuracy of the transfer process. In the recent ArF exposure technology and EUV exposure technology, the exposure light especially has short wavelengths and, hence, even a slight deformation of the mask can considerably affect the accuracy of the transfer process. As a result, a problem arises in that it is difficult to transfer a desired pattern to the substrate to be processed.

The present invention has been achieved under such circumstances. An object of the invention is to provide a substrate for mask blank use and a mask blank that are capable of giving a mask which can be significantly curbed from deforming when chucked to an exposure apparatus.

In the present invention, the following substrate for use as a mask blank is provided: a substrate for use as a mask blank, the substrate having a first main surface and a second main surface, which face each other, wherein:

a normal region of a square shape in which each side has a length $L_2$ is present in an approximately central part of the first main surface, the normal region is configured of a frame-shaped region corresponding to a peripheral part of the normal region and an inner region surrounded by the frame-shaped region, the inner region has a square shape in which each side has a length $L_3$ of 132 mm, the frame-shaped region includes: an outer frame comprising four sides which coincide with the sides of the square shape of the normal region; and an inner frame comprising four sides which coincide with the sides of the square shape of the inner region, the outer frame having a shape that coincides with a shape formed by enlarging the inner frame so that the sides of the inner frame are moved parallel outward just by 8 mm each, when the vertexes of the outer frame of the frame-shaped region are referred to respectively as vertexes $A_2$, $B_2$, $C_2$, and $D_2$ counterclockwise, the frame-shaped region includes first to fourth corner regions respectively in an each corner part, the first corner region including the vertex $A_2$, the second corner region including the vertex $B_2$, the third corner region including the vertex $C_2$, the fourth corner region including the vertex $D_2$, and each corner region having a square shape in which each side has a length of 8 mm, in the frame-shaped region, a first middle region having a square shape in which each side has a length of 8 mm is present in the middle position between the first corner region and the fourth corner region, a second middle region having a square shape in which each side has a length of 8 mm is present in the middle position between the first corner region and the second corner region, a third middle region having a square shape in which each side has a length of 8 mm is present in the middle position between the second corner region and the third corner region, and a fourth middle region having a square shape in which each side has a length of 8 mm is present in the middle position between the third corner region and the fourth corner region, (i) the inner region has a flatness $F_{in1}$ of 100 nm or less, the flatness being determined on the basis of a least-squares plane $PP_1$ of the normal region, and (ii) when one of the corner regions of the frame-shaped region is referred to as an n-th corner region and two middle regions nearest to the n-th corner region are respectively referred to as a first near middle region and a second near middle region, and when the maximum height and minimum height of the n-th corner region are expressed by $H_{max}(C_n)$ and $H_{min}(C_n)$, respectively, the maximum height and minimum height of the first near middle region are expressed by $H_{max}(M_1)$ and $H_{min}(M_1)$, respectively, and the maximum height and minimum height of the second near middle region are expressed by $H_{max}(M_2)$ and $H_{min}(M_2)$, respectively, the maximum heights and the minimum heights being determined on the basis of the least-squares plane $PP_1$, the frame-shaped region has a maximum height difference $\Delta D$, as shown by the following expression (1), of 100 nm or less with respect to each of n=1 to 4:

$$\Delta D = \mathrm{Max}\{H_{max}(C_n)-H_{min}(M_1), H_{max}(C_n)-H_{min}(M_2), H_{max}(M_1)-H_{min}(C_n), H_{max}(M_2)-H_{min}(C_n)\} \quad \text{expression (1)}$$

wherein $\mathrm{Max}\{x_1, x_2, x_3, x_4\}$ means the maximum value among $x_1$ to $x_4$.

In addition, in the present invention, the following mask blank is provided: a mask blank comprising a substrate, wherein the mask blank has a first main surface and a second main surface, the second main surface is a main surface on the side where a layer for circuit pattern has been disposed a normal region of a square shape in which each side has a length $L_2$ is present in an approximately central part of the first main surface, the normal region is configured of a frame-shaped region corresponding to a peripheral part of the normal region and an inner region surrounded by the frame-shaped region, the inner region has a square shape in which each side has a length $L_3$ of 132 mm, the frame-shaped region includes an outer frame comprising four sides which coincide with the sides of the square shape of the normal region and an inner frame comprising four sides which coincide with the sides of the square shape of the inner region, the outer frame having a shape that coincides with a shape formed by enlarging the inner frame so that the sides of the inner frame are moved parallel outward just by 8 mm each, when the vertexes of the outer frame of the frame-shaped region are referred to respectively as vertexes $A_2$, $B_2$, $C_2$, and $D_2$ counterclockwise, the frame-shaped region includes first to fourth corner regions respectively in an each corner part, the first corner region including the vertex $A_2$, the second corner region including the vertex $B_2$, the third corner region including the vertex $C_2$, the fourth corner region including the vertex $D_2$, and each corner region having a square shape in which each side has a length of 8 mm, in the frame-shaped region, a first middle region having a square shape in which each side has a length of 8 mm is present in the middle position between the first corner region and the fourth corner region, a second middle region having a square shape in which each side has a length of 8 mm is present in the middle position between the first corner region and the second corner region, a third middle region having a square shape in which each side has a length of 8 mm is present in the middle position between the second corner region and the third corner region, and a fourth middle region having a square shape in which each side has a length of 8 mm is present in the middle position between the third corner region and the fourth corner region, (iii) the inner region has a flatness $F_{in1}$ of 200 nm or less, the flatness being determined on the basis of a least-squares plane $PP_1$ of the normal region, and (iv) when one of the corner regions of the frame-shaped region is referred to as an n-th corner region and two middle regions nearest to the n-th corner region are respectively referred to as a first near middle region and a second near middle region, and when the maximum height and minimum height of the n-th corner region are expressed by $H_{max}(C_n)$ and $H_{min}(C_n)$, respectively, the maximum height and minimum height of the first near middle region are expressed by $H_{max}(M_1)$ and $H_{min}(M_1)$, respectively, and the maximum height and minimum height of the second near middle region are expressed by $H_{max}(M$ and $H_{min}(M_2)$, respectively, the maximum heights and the minimum heights being determined on the basis of the least-squares plane $PP_1$, the frame-shaped region has a maximum height difference ΔD, as shown by the following expression (1), of 150 nm or less with respect to each of n=1 to 4:

$$\Delta D = \mathrm{Max}\{H_{max}(C_n)-H_{min}(M_1), H_{max}(C_n)-H_{min}(M_2),$$
$$H_{max}(M_1)-H_{min}(C_n), H_{max}(M_2)-H_{min}(C_n)\} \quad \text{expression (1)}$$

wherein $\mathrm{Max}\{x_1, x_2, x_3, x_4\}$ means the maximum value among $x_1$ to $x_4$.

The present invention can provide a substrate for mask blank use and a mask blank that are capable of giving a mask which can be significantly curbed from deforming when chucked to an exposure apparatus.

DETAILED DESCRIPTION OF THE INVENTION

Embodiment(s) of the present invention are explained below with reference to the drawings.

In the present invention, the term "mask blank" means a substrate that has, on one main surface thereof, a layer in which a desired pattern has not been formed, unlike the mask which has a pattern layer on one main surface of the substrate. Consequently, in the stage of "mask blank", a layer is usually disposed over the whole main surface of the substrate. Furthermore, the terms "substrate for mask blank use" and "substrate for use as a mask blank" both mean a substrate in which such a layer has not been disposed on the main surface.

(Substrate for Mask Blank Use in One Embodiment of the Present Invention)

Figure 1:
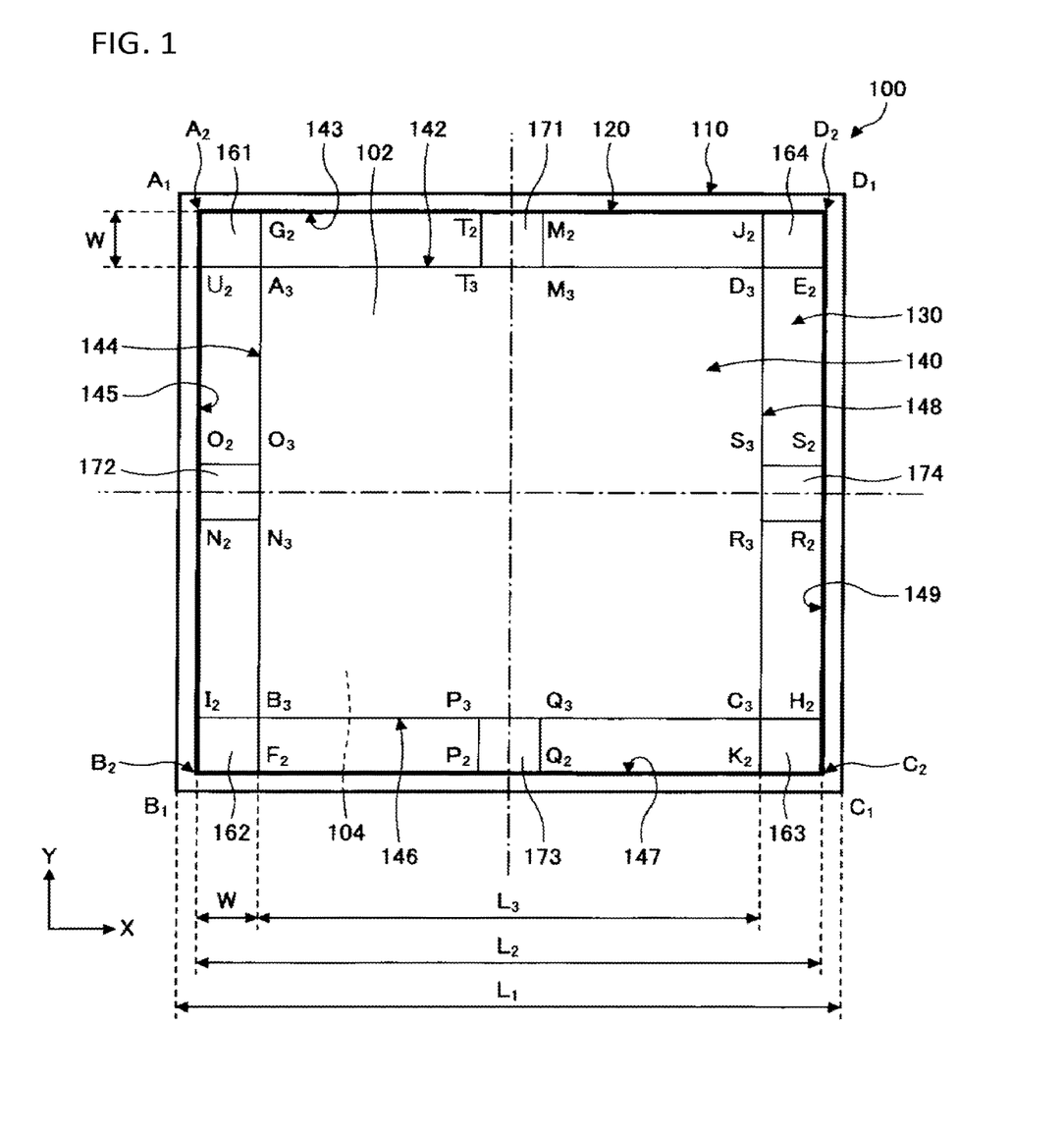
FIG. 1 is a plan view which schematically shows an example of a substrate for mask blank use in an embodiment of the present invention.

An embodiment of the present invention is explained with reference to FIG. 1. FIG. 1 schematically shows an example of a substrate for mask blank use in an embodiment of the present invention.

As shown in FIG. 1, the substrate 100 for mask blank use in one embodiment of the present invention (hereinafter referred to as "first substrate") has a first main surface 102 and a second main surface 104, which face each other. The first substrate 100 (the first main surface 102 thereof) has an approximately square shape, and each side thereof has a length $L_1$ of, for example, 152 mm.

The first substrate 100 has a normal region 120 (the region which lies within the frame shown by thick lines in FIG. 1) in an approximately central part of the first main surface 102. The normal region 120 has a square shape in which each side has a length of $L_2$. The length $L_2$ is 148 mm. In the example shown in FIG. 1, the outline (square) 110 of the first main surface 102 coincides with a shape formed by moving outward the sides of the normal region 120, for example, by 2 mm each.

The normal region 120 is configured of a frame-shaped region 130 corresponding to a peripheral part of the normal region 120 and an inner region 140 surrounded by the frame-shaped region 130. In other words, the frame-shaped region 130 corresponds to a region formed by removing the inner region 140 from the normal region 120.

The inner region 140 is present in an approximately central part of the normal region 120, and has a square shape in which each side has a length $L_3$ of 132 mm. The sides of the inner region 140 are referred, counterclockwise from the upper side, as a first side (upper side) 142, a second side 144, a third side (lower side) 146, and a fourth side 148, respectively.

The frame-shaped region 130 is partitioned by an outer frame and an inner frame. The outer frame of the frame-shaped region 130 is configured of a first outer side 143 to a fourth outer side 149 which respectively coincide with the sides of the normal region 120. Meanwhile, the inner frame of the frame-shaped region 130 is configured of a first inner side 142 to a fourth inner side 148 which respectively coincide with the sides of the inner region 140.

With respect to the outer frame and inner frame of the frame-shaped region 130, the space between each outer side and the corresponding inner side parallel therewith (for example, the first inner side 142 and the first outer side 143), i.e., the width of the frame-shaped region 130 (see length W in FIG. 1), is 8 mm.

For the purpose of clearer explanation, the four points corresponding to the corners of the outline 110 of the first main surface 102 in the first substrate 100 are referred to as point $A_1$ to point $D_1$, respectively. As shown in FIG. 1, the upper left-hand corner is referred to as point $A_1$, and the remaining corners are counterclockwise called point $B_1$ to point $D_1$.

Likewise, the four points corresponding to the corners of the normal region 120 in the first substrate 100 are referred to as point $A_2$ to point $D_2$, respectively. The four points corresponding to the corners of the inner region 140 are referred to as point $A_3$ to point $D_3$, respectively. These manners of naming are the same as that for the corners of the first main surface 102.

Furthermore, as shown in FIG. 1, on the first main surface 102, the points at which an extension of the first inner side 142 of the frame-shaped region 130 (the first inner side 142 being also the first side of the inner region 140) meets the second and fourth outer sides 145 and 149 of the frame-shaped region 130 are referred to as point $U_2$ and point $E_2$, respectively. The points at which an extension of the second inner side 144 of the frame-shaped region 130 (the second inner side 144 being also the second side of the inner region 140) meets the third and first outer sides 147 and 143 of the frame-shaped region 130 are referred to as point $F_2$ and point $G_2$, respectively. The points at which an extension of the third inner side 146 of the frame-shaped region 130 (the third inner side 146 being also the third side of the inner region 140) meets the fourth and second outer sides 149 and 145 of the frame-shaped region 130 are referred to as point $H_2$ and point $I_2$, respectively. Furthermore, the points at which an extension of the fourth inner side 148 of the frame-shaped region 130 (the fourth inner side 148 being also the fourth side of the inner region 140) meets the first and third outer sides 143 and 147 of the frame-shaped region 130 are referred to as point $J_2$ and point $K_2$, respectively.

As a result, a first corner region 161 surrounded by the square $A_2U_2A_3G_2$ is partitioned in the upper left-hand corner of the frame-shaped region 130. Furthermore, a second corner region 162 surrounded by the square $B_2F_2B_3I_2$ is partitioned in the lower left-hand corner of the frame-shaped region 130; a third corner region 163 surrounded by the square $C_2H_2C_3K_2$ is present in the lower right-hand corner of the frame-shaped region 130; and a fourth corner region 164 surrounded by the square $D_2J_2D_3E_2$ is partitioned in the upper right-hand corner of the frame-shaped region 130. In each of these corner regions 161 to 164, each side has a length of 8 mm.

Moreover, as shown in FIG. 1, in the frame-shaped region 130, the square portion being present just in the middle position between the first corner region 161 and the fourth corner region 164 is referred to as a first middle region 171; the square portion being present just in the middle position between the first corner region 161 and the second corner region 162 is referred to as a second middle region 172; the square portion being present just in the middle position between the second corner region 162 and the third corner region 163 is referred to as a third middle region 173; and the square portion being present just in the middle position between the third corner region 163 and the fourth corner region 164 is referred to as a fourth middle region 174.

These middle regions 171 to 174 each have a square shape in which each side has a length of 8 mm. For example, the first middle region 171 is indicated by the square $T_2T_3M_3M_2$, the second middle region 172 is indicated by the square $N_2N_3O_3O_2$, the third middle region 173 is indicated by the square $Q_2Q_3P_3P_2$, and the fourth middle region 174 is indicated by the square $S_2S_3R_3R_2$. The points $T_2$, $M_2$, $N_2$, $O_2$, $P_2$, $Q_2$, $R_2$, and $S_2$ are points lying on the outer sides 143, 145, 147, and 149 of the frame-shaped region 130. Meanwhile, the points $T_3$, $M_3$, $N_3$, $O_3$, $P_3$, $Q_3$, $R_3$, and $S_3$ are points lying on the inner sides 142, 144, 146, and 148 of the frame-shaped region 130.

The first substrate 100 has the following feature: (i) the inner region 140 has a flatness $F_{in1}$ of 100 nm or less, the flatness being determined on the basis of a least-squares plane $PP_1$ of the normal region 120.

The "flatness $F_{in1}$" of the inner region 140 can be determined from the difference between a maximum height and minimum height of the concavity and convexity of the surface of the inner region 140, on the basis of a least-squares plane $PP_1$ of the normal region 120. The above difference can be measured by using a FUJINON flatness instrument.

The first substrate 100 further has the following feature:
(ii) when one of the corner regions of the frame-shaped region 130 is referred to as an n-th corner region and two middle regions nearest to the n-th corner region are respectively referred to as a first near middle region and a second near middle region, and when the maximum height and minimum height of the n-th corner region are expressed by $H_{max}(C_n)$ and $H_{min}(C_n)$, respectively, the maximum height and minimum height of the first near middle region are expressed by $H_{max}(M_1)$ and $H_{min}(M_1)$, respectively, and the maximum height and minimum height of the second near middle region are expressed by $H_{max}(M_2)$ and $H_{min}(M_2)$, respectively, the maximum heights and the minimum heights being determined on the basis of the least-squares plane $PP_1$, the frame-shaped region 130 has a maximum height difference ΔD, as shown by the following expression (1), of 100 nm or less with respect to each of n=1 to 4.

$$\Delta D = \text{Max}\{H_{max}(C_n) - H_{min}(M_1), H_{max}(C_n) - H_{min}(M_2), H_{max}(M_1) H -_{min}(C_n), H_{max}(M_2) - H_{min}(C_n)\} \quad \text{expression (1)}$$

In the expression (1), Max $\{x_1, x_2, x_3, x_4\}$ means the maximum value among $x_1$ to $x_4$.

For example, in the case of n=1, the feature relates to the first corner region 161 of the frame-shaped region 130, and the two middle regions nearest to the first corner region 161 are the first middle region 171 and the second middle region 172.

Consequently, when the maximum height and minimum height of the first corner region 161 are expressed by $H_{max}(C_1)$ and $H_{min}(C_1)$, respectively, the maximum height and minimum height of the first middle region 171 are expressed by $H_{max}(M_1)$ and $H_{min}(M_1)$, respectively, and the maximum height and minimum height of the second middle region 172 are expressed by $H_{max}(M_2)$ and $H_{min}(M_2)$, respectively, the maximum heights and the minimum heights being determined on the basis of the least-squares plane $PP_1$ of the normal region 120, the first substrate 100 is configured so that the maximum height difference ΔD represented by the expression (1) is 100 nm or less.

In the case of n=2, the feature relates to the second corner region 162 of the frame-shaped region 130, and the two middle regions nearest to the second corner region 162 are the second middle region 172 and the third middle region 173.

Consequently, when the maximum height and minimum height of the second corner region 162 are expressed by $H_{max}(C_2)$ and $H_{min}(C_2)$, respectively, the maximum height and minimum height of the second middle region 172 are expressed by $H_{max}(M_1)$ and $H_{min}(M_1)$, respectively, and the maximum height and minimum height of the third middle region 173 are expressed by $H_{max}(M_2)$ and $H_{min}(M_2)$, respectively, the maximum heights and the minimum heights being determined on the basis of the least-squares plane $PP_1$ of the normal region 120, the first substrate 100 is configured so that the maximum height difference ΔD represented by the expression (1) is 100 nm or less.

Likewise, in the case of n=3, the feature relates to the third corner region 163 of the frame-shaped region 130, and the two middle regions nearest to the third corner region 163 are the third middle region 173 and the fourth middle region 174.

Consequently, when the maximum height and minimum height of the third corner region 163 are expressed by $H_{max}(C_3)$ and $H_{min}(C_3)$, respectively, the maximum height and minimum height of the third middle region 173 are expressed by $H_{max}(M_1)$ and $H_{min}(M_1)$, respectively, and the maximum height and minimum height of the fourth middle region 174 are expressed by $H_{max}(M_2)$ and $H_{min}(M_2)$, respectively, the maximum heights and the minimum heights being determined on the basis of the least-squares plane $PP_1$ of the normal region 120, the first substrate 100 is configured so that the maximum height difference ΔD represented by the expression (1) is 100 nm or less.

Furthermore, in the case of n=4, the feature relates to the fourth corner region 164 of the frame-shaped region 130, and the two middle regions nearest to the fourth corner region 164 are the fourth middle region 174 and the first middle region 171.

Consequently, when the maximum height and minimum height of the fourth corner region 164 are expressed by $H_{max}(C_4)$ and $H_{min}(C_4)$, respectively, the maximum height and minimum height of the fourth middle region 174 are expressed by $H_{max}(M_1)$ and $H_{min}(M_1)$, respectively, and the maximum height and minimum height of the first middle region 171 are expressed by $H_{max}(M_2)$ and $H_{min}(M_2)$, respectively, the maximum heights and the minimum heights being determined on the basis of the least-squares plane $PP_1$ of the normal region 120, the first substrate 100 is configured so that the maximum height difference ΔD represented by the expression (1) is 100 nm or less.

The flatness $F_{in1}$ of the inner region of the substrate for mask blank use is preferably 80 nm or less and more preferably 50 nm or less. The maximum height difference ΔD of the substrate for mask blank use is preferably 75 nm or less and more preferably 50 nm or less.

In the case where a substrate for mask blank use is configured so as to have the features (i) to (ii) described above, this substrate for mask blank use gives a mask blank which, through impartation of a transfer pattern to the film-coated surface thereof, gives a mask that can be significantly curbed from deforming upon chucking to an exposure apparatus, as will be described later in detail.

Consequently, in a case where the first substrate 100 is applied to masks, it is possible to significantly mitigate the aforementioned conventional problem such as the decrease in the accuracy of the transfer process. In particular, the first substrate 100 can exhibit such an effect even when applied to masks for the ArF exposure technology and EUV exposure technology.

(Other Features)

The first substrate 100 is formed of a transparent material. For example, use of quartz glass having an $SiO_2$ content of 90% by mass or more is preferred as the first substrate 100. The upper limit of the $SiO_2$ content in the quartz glass is 100% by mass. As compared with general soda-lime glass, quartz glass has a lower coefficient of linear expansion and shows smaller dimensional changes caused by changing temperature. The quartz glass may contain $TiO_2$, in addition to $SiO_2$. The quartz glass may include $SiO_2$ in an amount of 90% by mass to 95% by mass and $TiO_2$ in amount of 5% by mass to 10% by mass. In the case where the $TiO_2$ content is 5% by mass to 10% by mass, the coefficient of linear expansion of this quartz glass at temperatures around room temperature is approximately zero and the glass dimensionally changes little at around room temperature.

Specifically, a low-expansion glass having a coefficient of thermal expansion at 20° C. of 0±30 ppb/° C. is preferred. An ultralow-expansion glass having a coefficient of thermal expansion at 20° C. of 0±10 ppb/° C. is more preferred. An ultralow-expansion glass having a coefficient of thermal expansion at 20° C. of 0±5 ppb/° C. is especially preferred.

So long as a transmissive mask or a reflective mask is constituted of such a glass having a low coefficient of thermal expansion, the mask can sufficiently accommodate temperature changes in a semiconductor device production step to enable the highly fine circuit pattern to be satisfactorily transferred. Although the quartz glass may contain minor components besides $SiO_2$ and $TiO_2$, it is preferable that the quartz glass should contain no minor components.

The thickness of the first substrate 100 is, for example, in the range of 6.25 mm to 6.45 mm.

As described above, the first substrate 100, when chucked as a mask to an exposure apparatus, can be significantly curbed from deforming.

For example, when the first substrate 100 has been attached to the stage in the "whole-surface chucking mode" thorough the contact of the first main surface 102 with the stage, the flatness of the second main surface 104 can be regulated to 50 nm or less.

The term "whole-surface chucking mode" herein means the mode in which the whole of a main surface of an object to be attached, such as a mask, is chucked to the stage, unlike the "two-side chucking mode", in which only two sides of the substance to be attached are chucked to the stage, or the "four-side chucking mode", in which the four sides thereof in the shape of a frame are chucked to the stage.

Meanwhile, the flatness of the second main surface 104 (hereinafter referred to as "second flatness $F_{in2}$") is defined like the flatness $F_{in1}$ of the inner region 140 in the first main surface 102 as described above. More specifically, that region in the second main surface 104 which corresponds to the normal region 120 of the first main surface 102 described above is referred to as a "backside normal region", and the region which corresponds to the inner region 140 of the first main surface 102 is referred to as a "backside inner region". Then, the second flatness $F_{in2}$ can be determined from the difference between the maximum height and minimum height of concavity and convexity of the surface of the backside inner region, on the basis of a least-squares plane $PP_2$ of the backside normal region.

Features of the substrate for mask blank use in an embodiment of the present invention are explained above using the first substrate 100 as an example. However, the explanations given above are merely on examples, and it is apparent to persons skilled in the art that the substrate for mask blank use in the present invention may have other configuration(s) and/or feature(s).

For example, in the example shown in FIG. 1, the first main surface 102 of the first substrate 100 has a square shape in which each side has a length $L_1$ of 152 mm. However, the length $L_1$ of one side of the first main surface 102 and the shape of the first main surface 102 should not be construed as being limited to those. Namely, it should be noted that the dimensions and shape of the first main surface 102 are not especially limited so long as a normal region 120 in which one side has a length $L_2$ of 148 mm can be present within the first main surface 102.

(Process for Producing the First Substrate)

An example of processes for producing the first substrate 100 having the features described above is briefly explained below.

It should, however, be noted that the process shown below is a mere example and the first substrate 100 may be produced by other processes. Here, a process for producing the first substrate 100 is explained with respect to an example in which the substrate is a glass substrate.

This process for producing the first substrate 100 (hereinafter referred to as "first production process") includes:

(1) an information acquisition step of acquiring information on a glass substrate; and (2) a polishing step of polishing the glass substrate.

Each of the steps is explained below.

(1. Information Acquisition Step)

First, a glass substrate as a raw material is prepared. The glass substrate has first and second main surfaces. The glass substrate has, for example, a square shape in which each side has a length of 152 mm.

Next, the first and second main surfaces of the glass substrate are examined for surface roughness profile, least-squares plane, PV value (difference between maximum height and minimum height), etc. (hereinafter, these properties are inclusively referred to as "surface parameters"). Thus, information on the concavity and convexity of the main surfaces of the unprocessed glass substrate (hereinafter, the information is referred to as "initial surface parameters") is acquired.

(2. Polishing Step)

Next, the glass substrate is polished.

The polishing step includes a preliminary polishing step, a local polishing step, and a finish polishing step. These steps are briefly explained below.

(Preliminary Polishing Step)

First, the glass substrate is subjected to preliminary polishing.

In this preliminary polishing step, the glass substrate is roughly polished so that the surface roughness and PV value of each of the first and second main surfaces fall within given ranges. In this polishing, the glass substrate is roughly polished on the basis of the information on initial surface parameters acquired in the information acquisition step described above.

Conventional methods can be applied to the preliminary polishing step. For example, a plurality of both-side lapping devices may be consecutively used to perform the preliminary polishing of the first and second main surfaces of the glass substrate. In this operation, rigid urethane foam or suede pads may be used as polishing cloth, and cerium oxide having a particle diameter of 0.5 μm to 2 μm may be used as an abrasive material.

After the preliminary polishing step, the first and second main surfaces are examined again for the surface parameters to ascertain the surface state.

(Local Polishing Step)

Next, the first main surface of the glass substrate is locally polished.

This local polishing step is conducted by scanning the first main surface of the glass substrate with a local-processing tool. As the local-processing tool, conventional tool(s) can be used. Examples thereof include ion beam etching, gas cluster ion beam (GCIB) etching, plasma etching, wet etching, polishing with a magnetic fluid, polishing with a rotary polishing tool, and the like.

This local polishing step is conducted so that the features (i) and (ii), which the first substrate 100 described above has, are obtained with respect to the first main surface of the glass substrate. The local polishing step may hence be conducted on the basis of a simulated distribution of contour lines of the first main surface.

In the course of the local polishing step, the measurement of the surface parameters shown above may be conducted with regard to the first main surface, in order to ascertain the surface state.

In a case where it is ascertained, as a result of the measurement, that the features (i) and (ii) described above have been obtained with respect to the first main surface of the glass substrate, the local polishing step is completed.

(Finish Polishing Step)

Next, the first and second main surfaces of the glass substrate are subjected to final polishing.

In this step, polishing pads having a larger area than the main surfaces of the glass substrate may be used to polish the main surfaces of the glass substrate while supplying a polishing slurry. Such large polishing pads are used in order to simultaneously polish the whole main surfaces of the glass substrate.

As the polishing pads, for example, the polishing pads having a polyurethane resin foam layer which are obtained by impregnating base fabric, e.g., nonwoven fabric, with a polyurethane resin can be used.

The polishing slurry usually includes abrasive grains and a dispersion medium therefor. The polishing slurry may contain colloidal silica or cerium oxide. Colloidal silica is preferred because the glass substrate can be precisely polished therewith.

Examples of the dispersion medium for the abrasive grains include water and organic solvents.

As described above, the first and second main surfaces of the glass substrate are finally finished.

By the steps described above, a first substrate 100 having the features (i) and (ii) described hereinabove can be produced.

(Mask Blank in One Embodiment of the Present Invention)

Next, examples of a mask blank in an embodiment of the present invention are explained. Here, a reflective mask blank and a transmissive mask blank are explained with reference to respective drawings.

(Reflective Mask Blank)

Figure 2:
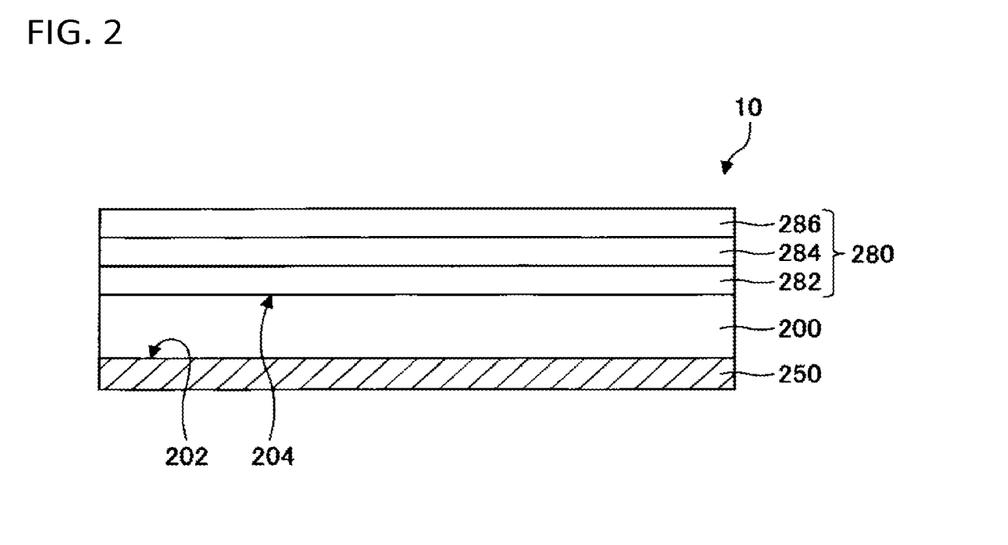
FIG. 2 is a cross-sectional view which schematically shows an example of the configuration of a reflective mask blank in an embodiment of the present invention.

FIG. 2 schematically shows a cross-section of a reflective mask blank in one embodiment of the present invention.

As shown in FIG. 2, this reflective mask blank (hereinafter referred to as "first mask blank") 10 includes a substrate 200.

The substrate 200 has a first main surface 202 and a second main surface 204, which face each other. A first layer 250 is placed on the first main surface 202 of the substrate 200, and a second layer 280 is placed on the second main surface 204 of the substrate 200.

As shown in FIG. 2, in the first mask blank 10, the main surface on the side of the first layer 250 is referred to as the first main surface 12 of the first mask blank 10, and the main surface on the side of the second layer 280 is referred to as the second main surface 14 of the first mask blank 10.

The first layer 250 is a conductive film, and is formed of, for example, chromium nitride or the like. The disposition of the first layer 250 renders the first mask blank 10 capable of being electrostatically chucked to stages.

Meanwhile, the second layer 280 is composed of a plurality of films. More specifically, the second layer 280 includes, for example, a reflective film 282, a protective film 284, and an absorbing film 286 and so on in this order from the side near the substrate 200.

Of these films, the reflective film 282 has the function of reflecting light such as EUV exposure light. The reflective film 282 may have a repeating structure of, for example, Mo film/Si film.

The protective film 284 serves to protect the reflective film 282 when the absorbing film 286 is processed for forming a pattern therein. The protective film 284 may be formed of, for example, Ru or Ru compounds. However, the protective film 284 is not an essential component and may be omitted.

The absorbing film 286 is formed of a material which absorbs exposure light. The absorbing film 286 is provided so as to have a pattern structure when the first mask blank 10 is used as a mask, so that this pattern can be transferred to substrates to be processed in a transfer process.

A low-reflection film (e.g. TaON, TaO or the like) may be formed on/above the absorbing film 286 on the side opposite to the reflective film 282. The low-reflection film has lower reflectance properties in response to light for inspection of circuit pattern of the absorbing film 286 than those of the absorbing film 286. The reflectance of the inspection light by the low-reflection film is lower than the reflectance of the inspection light by the absorbing film 286.

Specifications of the first layer 250 and second layer 280 and methods for forming these layers are the same as in the case of conventional reflective mask blanks. Further explanations on these layers are hence omitted here.

The first mask blank 10 having such a configuration is utilized, for example, in the EUV exposure technology.

In the case where the first mask blank 10 is actually used as a mask in the EUV exposure technology, the mask is chucked to the stage of the exposure apparatus so that the first main surface 12 faces the stage. The second main surface 14 is on the side which is irradiated with exposure light.

The first mask blank 10 is configured so as to have the features (iii) and (iv) described above.

In the features (iii) and (iv), the preferable ranges of the flatness $F_{in1}$ of the inner region and the maximum height difference $\Delta D$ in the first mask blank 10 is different in some degree from the flatness $F_{in1}$ and the maximum height difference $\Delta D$ in the substrate 100 for use as the first mask blank. This is because, when a substrate for mask blank use is subjected to deposition to produce a mask blank, the substrate for mask blank use is generally warped by film stress. As a result, the flatness $F_{in1}$ and maximum height difference $\Delta D$ of the main surface of the mask blank is generally larger than the flatness $F_{in1}$ and maximum height difference $\Delta D$ of the main surface of the substrate for mask blank use.

However, even if such a deformation is occurred, the mask blank is configured so as to have the features (iii) and (iv) described above, and as a result, when a mask to be produced from the mask blank is chucked to the exposure apparatus, the deformation of the mask can be significantly suppressed as compared with conventional cases. In addition, it is also possible to highly accurately transfer the desired pattern to substrates to be processed.

In the first mask blank 10, the flatness $F_{11}$ of the inner region is preferably 180 nm or less and more preferably 150 nm or less, and the maximum height difference $\Delta D$ is preferably 125 nm or less and more preferably 100 nm or less.

Consequently, in a case where a mask obtained from the first mask blank 10 is chucked to an exposure apparatus, this mask can be significantly curbed from deforming as compared with conventional masks. It is hence possible to highly accurately transfer the desired pattern to substrates to be processed.

(Transmissive Mask Blank)

Figure 3:
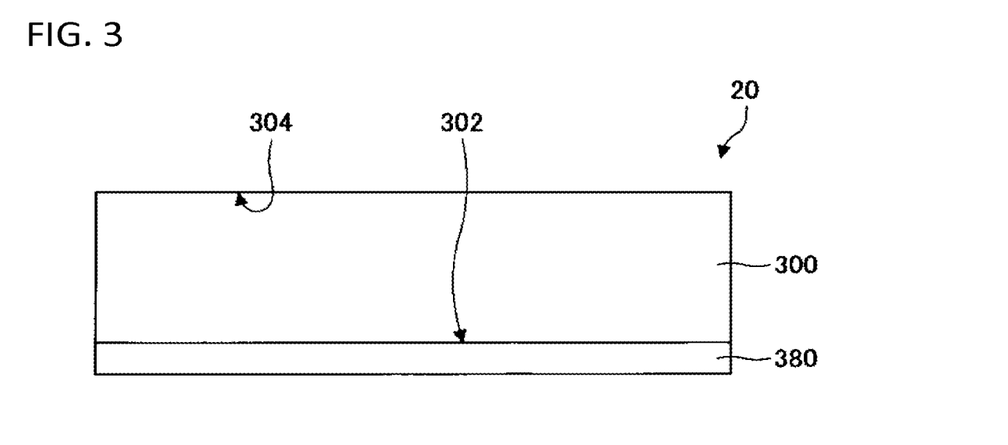
FIG. 3 is a cross-sectional view which schematically shows an example of the configuration of a transmissive mask blank in an embodiment of the present invention.

FIG. 3 schematically shows a cross-section of a transmissive mask blank in one embodiment of the present invention.

As shown in FIG. 3, this transmissive mask blank (hereinafter referred to as "second mask bland") 20 includes a substrate 300.

The substrate 300 has a first main surface 302 and a second main surface 304, which face each other. A first layer 380 is placed on the first main surface 302 of the substrate 300.

As shown in FIG. 3, in the second mask blank 20, the main surface on the side of the first layer 380 is referred to as the first main surface 22 of the second mask blank 20, and the main surface on the opposite side is referred to as the second main surface 24 of the second mask blank 20.

The first layer 380 may be composed of a plurality of films although such configuration is not clearly shown in FIG. 3. The films may include, for example, a light-shielding film and/or a half-tone film, etc.

Specifications of the first layer 380 and methods for forming the layer are the same as in the case of conventional transmissive mask blanks. Further explanations on the layer are hence omitted here.

The second mask blank 20 having such a configuration is utilized, for example, in the ArF exposure technology.

In a case where the second mask blank 20 is actually used as a mask in the ArF exposure technology, the mask is chucked to the stage of the exposure apparatus so that the first main surface 302 of the substrate 300 faces the stage. This second main surface 304 is on the side which is irradiated with exposure light.

The second mask blank 20 is configured so as to have the features (iii) and (iv) described above.

In also this case, in a case where a mask obtained from the second mask blank 20 is chucked to an exposure apparatus, this mask can be significantly curbed from deforming as compared with conventional masks. It is hence possible to highly accurately transfer the desired pattern to substrates to be processed.

In the second mask blank 20, the maximum height difference ΔD is preferably 125 nm or less and more preferably 100 nm or less.

EXAMPLES

Next, examples of the present invention are explained. In the following explanation, Example 1 is Working Example in the present invention and Example 2 and Example 3 are Comparative Examples.

(Preparation)

First, 13 sheets of glass substrates were prepared and each subjected to preliminary polishing.

As the glass substrates, $TiO_2$-doped glass substrates were used. These glass substrates each had a square shape having dimensions of 152 mm (length)×152 mm (width).

The surface parameters of the first and second main surfaces of each glass substrate were measured after the preliminary polishing. As a result, it was found that in each glass substrate, the difference between the maximum height and minimum height in the first main surface was in the range of 200 nm to 350 nm. The difference between the maximum height and minimum height was measured by using a FUJINON flatness instrument.

Furthermore, the surface roughness (arithmetic mean roughness Ra) of each first main surface was measured by using a white-light interferometer with respect to an area of 2.8 mm×2.1 mm. As a result, the arithmetic mean roughness Ra was found to be 0.8 nm to 1.2 nm. Values within the same range were obtained also for the second main surfaces.

The glass substrates which had undergone the preliminary polishing each had a thickness in the range of 6.448 mm to 6.449 mm.

Example 1

With respect to seven sheets of the glass substrates which had undergone the preliminary polishing, the first main surfaces were subjected to local polishing. A rotary compact processing tool having a polishing region with a diameter of 15 mm was used for the local polishing.

The conditions for the local polishing were as follows.

Abrasive material: cerium oxide having an average particle diameter (D50) of 2 μm Polishing pad: flexible pad (Bellatrix N7512, manufactured by Filwel Co. Ltd.)

Rotation speed of polishing part: 400 rpm

Polishing pressure: 2.5 $gf/mm^2$

Figure 4:
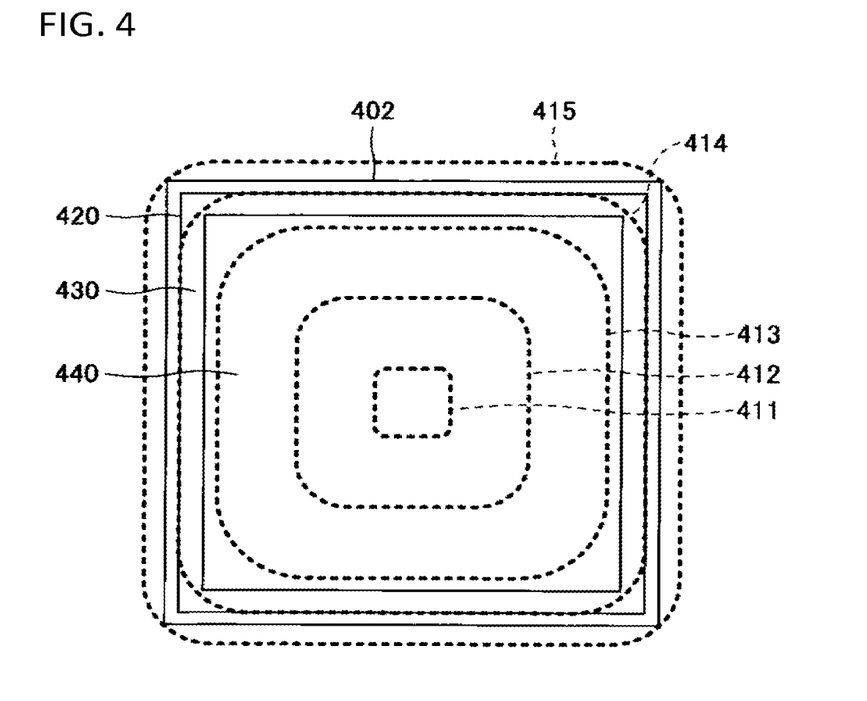
FIG. 4 is a view which schematically shows a distribution of contour lines that was supposed to be obtained in a first main surface by local polishing in Example 1.

The local polishing was conducted with the aim of obtaining a supposed distribution of contour lines which is shown in FIG. 4, in each first main surface.

FIG. 4 schematically shows a distribution of contour lines that was supposed to be obtained in each first main surface by the local polishing in Example 1.

As shown in FIG. 4, the first main surface 402 includes a normal region 420 (148 mm×148 mm), and this normal region 420 could be partitioned into a frame-shaped region 430 and an inner region 440 (132 mm×132 mm). The contour lines 411 to 415 each has an approximately square shape in which the corners have been rounded, and the centers of the squares coincide with the center of the first main surface 402.

The larger the dimensions of the square of each of the contour lines 411 to 415, the higher the level thereof (that is, the higher the surface). Conversely speaking, the smaller the dimensions of the square, the lower the level thereof (that is, the lower the surface). The difference in height level between adjacent contour lines is about 100 nm.

When performing the local polishing, care was taken to make the frame-shaped region 430 cross as few contour lines as possible. For example, in the example shown in FIG. 4, the frame-shaped region 430 has only one contour line 414, which crosses the frame-shaped region 430 in the four corner regions, and this contour line 414 substantially coincides with the outer frame of the frame-shaped region 430 (the contour line 414 hence does not substantially cross the parts of the frame-shaped region 430 other than the corner regions).

After completion of such local polishing, both main surfaces of each glass substrate were subjected to finish polishing.

The conditions for the finish polishing were as follows.

Polishing tester: both-side 24B polishing machine (manufactured by Hamai Co., Ltd.)

Polishing pads: Bellatrix N7512 (manufactured by Filwel Co. Ltd.)

Rotation speed of polishing table: 10 rpm polishing time: 30 min

Polishing load: 0.52 $gf/mm^2$

Amount removed by polishing: 0.06 μm/surface

Diluent water: pure water (foreign matter not smaller than 0.1 μm had been removed by filtering)

Polishing slurry: containing 20% by mass colloidal silica having an average primary-particle diameter less than 20 nm Flow rate of polishing slurry: 10 L/min By the steps described above, seven sheets of substrates for mask blank use were obtained. These substrates for mask blank use are referred to as sample 1-1 to sample 1-7, respectively.

After completion of the finish polishing step, the difference between the maximum height and minimum height in each of the substrates for mask blank use was measured by using a FUJINON flatness instrument.

Example 2

Four sheets of the glass substrates which had undergone the preliminary polishing were each subjected to local polishing of the first main surface in the same manner as in Example 1.

Figure 5:
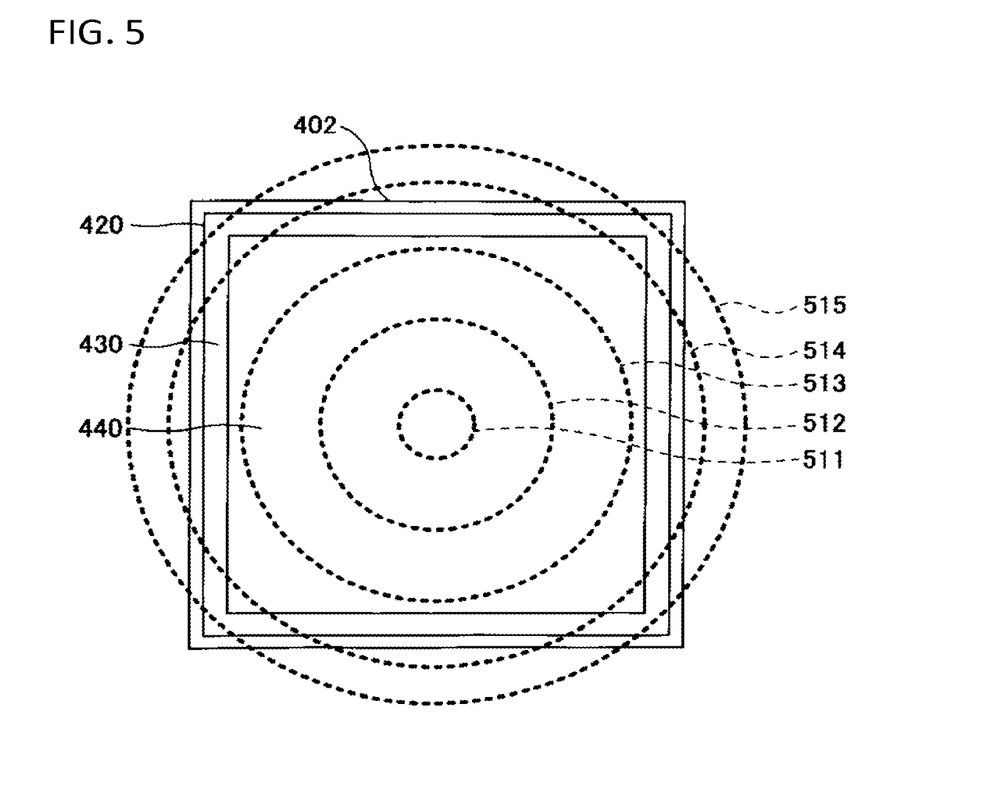
FIG. 5 is a view which schematically shows a distribution of contour lines that was supposed to be obtained in a first main surface by local polishing in Example 2.

In Example 2, however, the local polishing was conducted with the aim of obtaining a supposed distribution of contour lines which is shown in FIG. 5, in each first main surface.

FIG. 5 schematically shows a distribution of contour lines that was supposed to be obtained in each first main surface by the local polishing in Example 2.

As shown in FIG. 5, the first main surface 402 includes a normal region 420 (148 mm×148 mm), and this normal region 420 could be partitioned into a frame-shaped region 430 and an inner region 440 (132 mm×132 mm). The contour lines 511 to 515 each have an approximately circular shape, and the centers of the circles coincide with the center of the first main surface 402.

The larger the diameter of the circle of each of the contour lines 511 to 515, the higher the level thereof (that is, the higher the surface). Conversely speaking, the smaller the diameter of the circle, the lower the level thereof (that is, the lower the surface). The difference in height level between adjacent contour lines is about 100 nm.

In this Example, two contour lines 514 and 515 cross the frame-shaped region 430. In addition, in the four corner regions of the frame-shaped region 430, two regions differing in height are present, i.e., the region lying between the contour line 514 and the contour line 515 and the region lying outside the contour line 515.

After completion of such local polishing, both main surfaces of each glass substrate were subjected to the same finish polishing as in Example 1.

The substrates for mask blank use thus obtained are referred to as sample 2-1 to sample 2-4, respectively.

Example 3

Two sheets of the glass substrates which had undergone the preliminary polishing were each subjected to local polishing of the first main surface in the same manner as in Example 1.

Figure 6:
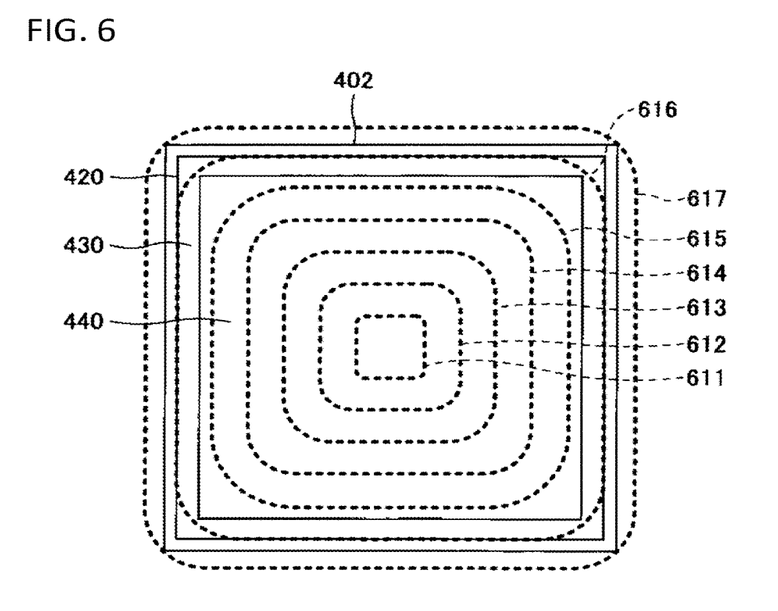
FIG. 6 is a view which schematically shows a distribution of contour lines that was supposed to be obtained in a first main surface by local polishing in Example 3.

In Example 3, however, the local polishing was conducted with the aim of obtaining a supposed distribution of contour lines which is shown in FIG. 6, in each first main surface.

FIG. 6 schematically shows a distribution of contour lines that was supposed to be obtained in each first main surface by the local polishing in Example 3.

As shown in FIG. 6, the first main surface 402 includes a normal region 420 (148 mm×148 mm), and this normal region 420 could be partitioned into a frame-shaped region 430 and an inner region 440 (132 mm×132 mm). The contour lines 611 to 617 each have an approximately square shape in which the corners have been rounded, and the centers of the squares coincide with the center of the first main surface 402.

The larger the dimensions of the square of each of the contour lines 611 to 617, the higher the level thereof (that is, the higher the surface). Conversely speaking, the smaller the dimensions of the square, the lower the level thereof (that is, the lower the surface). The difference in height level between adjacent contour lines is about 100 nm.

In this Example, the frame-shaped region 430 has only one contour line 616, which crosses the frame-shaped region 430 in the four corner regions, and this contour line 616 substantially coincides with the outer frame of the frame-shaped region 430 (the contour line 616 hence does not substantially cross the parts of the frame-shaped region 430 other than the corner regions).

After completion of such local polishing, both main surfaces of each glass substrate were subjected to the same finish polishing as in Example 1.

The substrates for mask blank use thus obtained are referred to as sample 3-1 and sample 3-2, respectively.

(Evaluation)

The samples thus prepared were subjected to the following evaluation.

Hereinafter, regions in the first main surface of each sample are expressed by the same appellations as those used in FIG. 1.

(Flatness $F_{in1}$ of Inner Region)

The central inner region (square region where $L_2$=132 mm) in the first main surface of each sample was evaluated for flatness $F_{in1}$.

As described above, the flatness $F_{in1}$ of the inner region was determined by examining the normal region for least-squares plane $PP_1$ and calculating the flatness on the basis of the least-squares plane $PP_1$.

(Maximum Height Difference ΔD)

The maximum height difference ΔD, which is shown by the expression (1) described hereinabove, in the first main surface of each sample was calculated.

The flatness $F_{in1}$ of the inner region and the maximum height difference ΔD which were obtained with respect to each sample are summarized in Table 1 below.

TABLE 1

| Sample | Flatness of inner region $F_{in1}$ (nm) | Maximum height difference ΔD (nm) | Chucked-state flatness (nm) |
|---|---|---|---|
| 1-1 | 31 | 97 | 21 |
| 1-2 | 38 | 74 | 22 |
| 1-3 | 30 | 82 | 30 |
| 1-4 | 30 | 46 | 24 |
| 1-5 | 59 | 82 | 25 |
| 1-6 | 65 | 69 | 24 |
| 1-7 | 60 | 79 | 27 |
| 2-1 | 29 | 129 | 54 |
| 2-2 | 34 | 124 | 51 |
| 2-3 | 37 | 143 | 57 |
| 2-4 | 79 | 177 | 72 |
| 3-1 | 108 | 95 | 52 |
| 3-2 | 109 | 86 | 73 |

(Chucked-State Flatness)

Next, each sample was attached under vacuum to a stage in the whole-surface chucking mode, and the resultant deformed state of the sample was evaluated. In this evaluation, each sample was attached under vacuum so that the first main surface came into contact with the stage.

The deformed state was evaluated in terms of the second flatness $F_{in2}$ of the second main surface of each sample. As described above, this second flatness $F_{in2}$ is determined on the basis of a least-squares plane $PP_2$ of the backside normal region.

The results obtained by the evaluation of the samples are summarized in the column "Chucked-state flatness" in Table 1.

It can be found from Table 1 that in each of samples 1-1 to 1-7, the flatness $F_{in1}$ of the inner region was 100 nm or less. It can be also found that, in contrast thereto, samples 3-1 and 3-2 each had an inner-region flatness $F_{in1}$ exceeding 100 nm.

It can be further found that samples 1-1 to 1-7 each had a maximum height difference ΔD of 100 nm or less, whereas samples 2-1 to 2-4 each had a maximum height difference ΔD exceeding 100 nm.

Furthermore, it was found that samples 1-1 to 1-7 each had a chucked-state flatness of 30 nm or less, whereas samples 2-1 to 2-4 and samples 3-1 and 3-2 each had a chucked-state flatness exceeding 50 nm.

Figure 7:
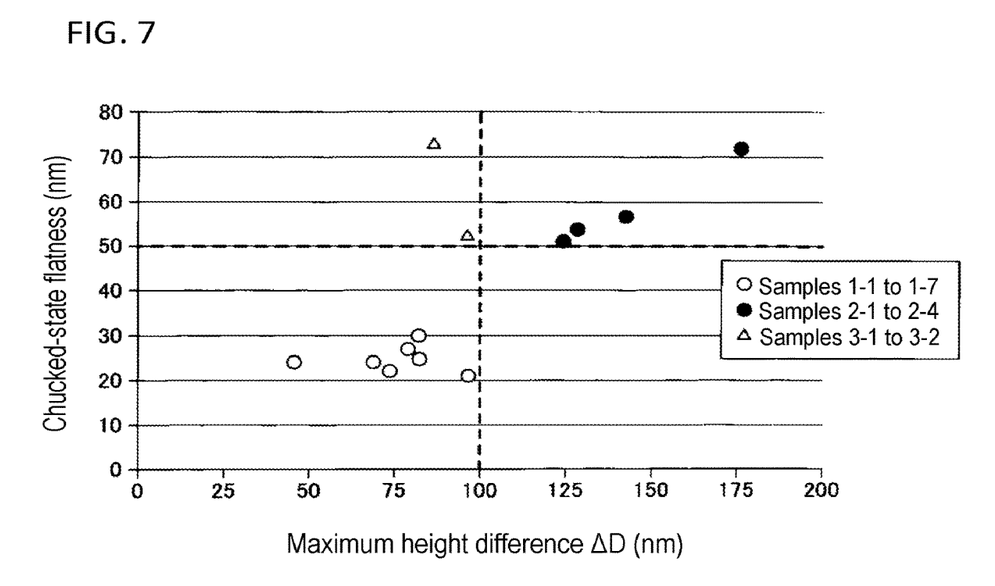
FIG. 7 is a graph obtained by plotting a relationship in each sample between the maximum height difference ΔD and the chucked-state flatness $F_{in2}$ of the second main surface.

FIG. 7 shows a graph obtained by plotting a relationship in each sample between the maximum height difference ΔD and the chucked-state flatness.

It can be found from FIG. 7 that in each of samples 2-1 to 2-4, 3-1 and 3-2, the chucked-state flatness exceeded 50 nm and the flatness was not so satisfactory. In contrast, it can be found that samples 1-1 to 1-7 each had a chucked-state flatness of 50 nm or less, in particular, 30 nm or less, and gave satisfactory results.

It was thus ascertained that by producing substrates for mask blank use so as to satisfy the features (i) and (ii) described above, the deformations which occur upon chucking are significantly reduced.

Example 11

By using the sample 1-1 obtained by the above-described method, a mask blank was produced in the following method.

(Formation of Conductive Film)

A conductive film was deposited on the first main surface of the sample 1-1 by using a magnetron sputtering method. The conductive film was a CrNH film.

The deposition conditions for the conductive film were as follows.

Target: Cr target
Degree of vacuum: $1\times10^{-4}$ Pa or less
Sputtering gas: Mixed gas of Ar, $N_2$ and $H_2$ (Ar: 58.2 vol %, $N_2$: 40 vol %, and $H_2$: 1.8 vol %)
Gas pressure: 0.1 Pa
Input power: 1,500 W
Deposition rate: 0.18 nm/sec
The target thickness of the conductive film was 185 nm.

(Formation of Reflective Film)

Next, a reflective film was formed on the second main surface of the sample 1-1 by using an ion bean sputtering method.

The reflective film was a multilayer reflective film of Mo/Si. More specifically, the deposition of the Mo layer (target thickness: 2.3 nm) and the deposition of the Si layer (target thickness: 4.5 nm) were alternately repeated for 50 times, thereby forming the multilayer reflective film of Mo/Si having a thickness of 340 nm.

The deposition conditions for the Mo layer were as follows.

Target: Mo target
Sputtering gas: Ar gas (gas pressure: 0.02 Pa)
Voltage: 700 V
Deposition rate: 0.064 nm/sec
The deposition conditions for the Si layer were as follows.
Target: Si target (boron-doped)
Sputtering gas: Ar gas (gas pressure: 0.02 Pa)
Voltage: 700 V
Deposition rate: 0.077 nm/sec (Formation of Protective Film)

Next, a protective film was formed on the reflective film by using an ion beam sputtering method. The protective film was a Ru layer.

The deposition conditions for the protective layer were as follows.

Target: Ru target
Sputtering gas: Ar gas (gas pressure: 0.02 Pa)
Voltage: 700 V
Deposition rate: 0.052 nm/sec
The target thickness of the protective film was 2.5 nm.

(Formation of Absorbing Film)

Next, an absorbing film was formed on the protective film by using a magnetron sputtering method. The absorbing film was a TaN layer.

The deposition conditions for the absorbing film were as follows.

Target: Ta target
Sputtering gas: Mixed gas of Ar and $N_2$ (Ar: 86 vol % and $N_2$: 14 vol %)
Gas pressure: 0.3 Pa
Input power: 150 W
Deposition rate: 7.2 nm/min
The target thickness of the absorbing film was 60 nm.

(Formation of Low-Reflection Film)

Next, a low-reflection film was formed on the absorbing film by using a magnetron sputtering method. The low-reflection film was a TaON layer.

The deposition conditions for the low-reflection film were as follows.

Target: Ta target
Sputtering gas: Mixed gas of Ar, $O_2$ and $N_2$ (Ar: 49 vol %, $O_2$: 37 vol % and $N_2$: 14 vol %)
Gas pressure: 0.3 Pa
Input power: 250 W
Deposition rate: 2.0 nm/min
The target thickness of the low-reflection film was 8 nm.

The mask blank including the sample 1-1 (hereinafter referred to as "mask blank 11") was produced by the above steps.

The difference between the maximum height and the minimum height in the mask blank 11 was measured by using a FUJINON flatness instrument.

Examples 12 to 17

Each of mask blanks 12 to 17 was produced by using the samples 1-2 to 1-7 in the same manner as in Example 11.

Examples 21 to 24

Each of mask blanks 21 to 24 was produced by using the samples 2-1 to 2-4 in the same manner as in Example 11.

Examples 31 to 32

Each of mask blanks 31 to 32 was produced by using the samples 3-1 to 3-2 in the same manner as in Example 11

(Evaluation)

Each of the mask blanks was evaluated in the same manner as in each of the above-described samples.

The evaluation results obtained in each of the mask blanks were shown in Table 2.

TABLE 2

| Sample | Flatness of inner region $F_{in1}$ (nm) | Maximum height difference $\Delta D$ (nm) | Chucked-state flatness (nm) |
|---|---|---|---|
| 11 | 131 | 148 | 22 |
| 12 | 150 | 123 | 23 |
| 13 | 149 | 141 | 30 |
| 14 | 131 | 98 | 23 |
| 15 | 177 | 135 | 25 |
| 16 | 183 | 119 | 23 |
| 17 | 179 | 136 | 28 |
| 21 | 142 | 188 | 54 |
| 22 | 148 | 177 | 52 |
| 23 | 146 | 197 | 57 |
| 24 | 189 | 235 | 72 |
| 31 | 212 | 147 | 52 |
| 32 | 227 | 139 | 73 |

As shown in Table 2, it can be found that in each of the mask blanks 11 to 17, the flatness $F_{in1}$ of the inner region was 200 nm or less. It can also be found that, in contrast thereto, in each of the mask blanks 31 and 32, the flatness $F_{in1}$ of the inner region exceeded 200 nm.

In addition, it can be found that in each of the mask blanks 11 to 17, the maximum height difference $\Delta D$ was 150 nm or less. It can also be found that, in contrast thereto, in each of the mask blanks 21 to 24, the maximum height difference $\Delta D$ exceeded 150 nm.

In addition, it was found that the mask blanks 11 to 17 each had a chucked-state flatness of 30 nm or less, whereas the mask blanks 21 to 24 and mask blanks 31 to 32 each had a chucked-state flatness exceeding 50 nm.

Figure 8:
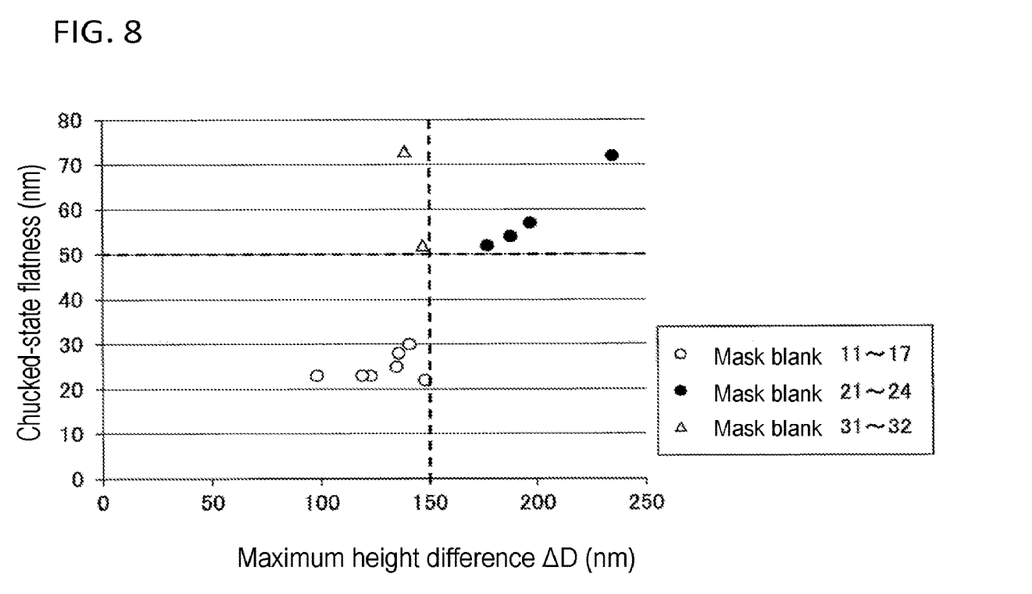
FIG. 8 is a graph obtained by plotting a relationship in each mask blank between the maximum height difference ΔD and the chucked-state flatness $F_{in2}$ of the second main surface.

FIG. 8 shows a graph obtained by plotting a relationship in each mask blank between the maximum height difference $\Delta D$ and the chucked-state flatness.

It can be found from FIG. 8 that in each of the mask blanks 21 to 24 and mask blanks 31 to 32, the chucked-state flatness exceeded 50 nm and the flatness was not so satisfactory. In contrast, it can be found that the mask blanks 11 to 17 each had a chucked-state flatness of 50 nm or less, in particular, 30 nm or less, and gave satisfactory results.

It was thus ascertained that by producing mask blanks so as to satisfy the features (iii) and (iv) described above, the deformations which occur upon chucking are significantly reduced.

While the present invention has been described in detail and with reference to specific embodiments thereof, it will be apparent to one skilled in the art that various changes and modifications can be made therein without departing from the spirit and scope thereof.

DESCRIPTION OF THE REFERENCE NUMERALS

10 Reflective mask blank
12 First main surface
14 Second main surface
20 Transmissive mask blank
22 First main surface
24 Second main surface
100 Substrate for mask blank use
102 First main surface
104 Second main surface
110 Outline
120 Normal region
130 Frame-shaped region
140 Inner region
142 First side (first inner side)
143 First outer side
144 Second side (second inner side)
145 Second outer side
146 Third side (third inner side)
147 Third outer side
148 Fourth side (fourth inner side)
149 Fourth outer side
161 First corner region
162 Second corner region
163 Third corner region
164 Fourth corner region
171 First middle region
172 Second middle region
173 Third middle region
174 Fourth middle region
200 Substrate
202 First main surface
204 Second main surface
250 First layer
280 Second layer
282 Reflective film
284 Protective film
286 Absorbing film
300 Substrate
302 First main surface
304 Second main surface
380 First layer
402 First main surface
420 Normal region
430 Frame-shaped region
440 Inner region
411 to 415 Contour lines
511 to 515 Contour lines
611 to 617 Contour lines

What is claimed is:

1. A substrate having a first main surface and a second main surface, which face each other, wherein:
the substrate is made of a quartz glass containing $TiO_2$ in an amount of 5 to 10 mass %,
the first main surface has a normal region having a square shape in which each side has a length $L_2$ in an approximately central part of the first main surface,
the normal region has a frame-shaped region which is a peripheral part of the normal region and an inner region surrounded by the frame-shaped region,
the inner region has a square shape in which each side has a length $L_3$ of 132 mm,
the frame-shaped region includes: an outer boundary having four sides which coincide with the sides of the square shape of the normal region; and an inner boundary having four sides which coincide with the sides of the square shape of the inner region, the outer boundary having a shape that coincides with a shape formed by enlarging the inner boundary so that the sides of the inner frame are moved parallel outward by 8 mm each,
when the vertexes of the outer boundary of the frame-shaped region are referred to respectively as vertexes $A_2$, $B_2$, $C_2$, and $D_2$ counterclockwise, the frame-shaped region includes first to fourth corner regions respectively in an each corner part of the frame-shaped region, the first corner region including the vertex $A_2$, the second corner region including the vertex $B_2$, the third corner region including the vertex $C_2$, the fourth corner region including the vertex $D_2$, and each corner region having a square shape in which each side has a length of 8 mm, the frame-shaped region has a first middle region having a square shape in which each side has a length of 8 mm in the middle position between the first corner region and the fourth corner region, a second middle region having a square shape in which each side has a length of 8 mm in the middle position between the first corner region and the second corner region, a third middle region having a square shape in which each side has a length of 8 mm in the middle position between the second corner region and the third corner region, and a fourth middle region having a square shape in which each side has a length of 8 mm in the middle position between the third corner region and the fourth corner region, and the following conditions (i), (ii), and (iii) are satisfied:

(i) the inner region has a flatness $F_{in1}$ of 100 nm or less, the flatness being determined on the basis of a least-squares plane of the normal region, (ii) when one of the corner regions of the frame-shaped region is referred to as an n-th corner region and two middle regions nearest to the n-th corner region are respectively referred to as a first near middle region and a second near middle region, and when the maximum height and minimum height of the n-th corner region are expressed by $H_{max}(C_n)$ and $H_{min}(C_n)$, respectively, the maximum height and minimum height of the first near middle region are expressed by $H_{max}(M_1)$ and $H_{min}(M_1)$, respectively, and the maximum height and minimum height of the second near middle region are expressed by $H_{max}(M_2)$ and $H_{max}(M_2)$, respectively, and the maximum heights and the minimum heights being determined on the basis of the least-squares plane of the normal region, a maximum height difference $\Delta D$ is 75 nm or less with respect to each of n=1 to 4, wherein the maximum height difference $\Delta D$ is represented by expression(1):

$$\Delta D = \text{Max } \{H_{max}(C_n)-H_{min}(M_1), H_{max}(C_n)-H_{min}(M_2), H_{max}(M_1)-H_{min}(C_n), H_{max}(M_2)-H_{min}(C_n)\} \quad \text{expression (1)}$$

wherein $\text{Max}\{x_1, x_2, x_3, x_4\}$ means the maximum value among $x_1$ to $x_4$, and (iii) the frame-shaped region includes at least one whole contour line therein, and wherein a contour line present in the frame-shaped region has an approximately square shape in which a space between sides opposite to each other is 132 mm to 148 mm.

2. The substrate for use as a mask blank according to claim 1, wherein the first main surface has a square shape in which each side has a length $L_1$ of 152 mm.

3. A mask blank comprising a substrate, and having a first main surface and a second main surface, wherein:

the substrate is made of a quartz glass containing $TiO_2$ in an amount of 5 to 10 mass %, the second main surface is a main surface on the side where a layer for circuit pattern is disposed, the first main surface has a normal region having a square shape in which each side has a length $L_2$ in an approximately central part of the first main surface, the normal region has a frame-shaped region which is a peripheral part of the normal region and an inner region surrounded by the frame-shaped region, the inner region has a square shape in which each side has a length $L_3$ of 132 mm, the frame-shaped region includes an outer boundary having four sides which coincide with the sides of the square shape of the normal region and an inner boundary having four sides which coincide with the sides of the square shape of the inner region, the outer boundary having a shape that coincides with a shape formed by enlarging the inner boundary so that the sides of the inner frame are moved parallel outward by 8 mm each, when the vertexes of the outer boundary of the frame-shaped region are referred to respectively as vertexes $A_2$, $B_2$, $C_2$, and $D_2$ counterclockwise, the frame-shaped region includes first to fourth corner regions respectively in an each corner part of the frame-shaped region, the first corner region including the vertex $A_2$, the second corner region including the vertex $B_2$, the third corner region including the vertex $C_2$, the fourth corner region including the vertex $D_2$, and each corner region having a square shape in which each side has a length of 8 mm, the frame-shaped region has a first middle region having a square shape in which each side has a length of 8 mm in the middle position between the first corner region and the fourth corner region, a second middle region having a square shape in which each side has a length of 8 mm in the middle position between the first corner region and the second corner region, a third middle region having a square shape in which each side has a length of 8 mm in the middle position between the second corner region and the third corner region, and a fourth middle region having a square shape in which each side has a length of 8 mm in the middle position between the third corner region and the fourth corner region, and the following conditions (iv), (v), and (vi) are satisfied:

(iv) the inner region has a flatness $F_{in1}$ of 200 nm or less, the flatness being determined on the basis of a least-squares plane of the normal region, (v) when one of the corner regions of the frame-shaped region is referred to as an n-th corner region and two middle regions nearest to the n-th corner region are respectively referred to as a first near middle region and a second near middle region, and when the maximum height and minimum height of the n-th corner region are expressed by $H_{max}(C_n)$ and $H_{min}(C_n)$, respectively, the maximum height and minimum height of the first near middle region are expressed by $H_{max}(C_n)$ and $H_{min}(C_n)$, respectively, and the maximum height and minimum height of the second near middle region are expressed by $H_{max}(C_n)$ and $H_{min}(C_n)$, respectively, the maximum heights and the minimum heights being determined on the basis of the least-squares plane of the normal region, a maximum height difference $\Delta D$ is 125 nm or less with respect to each of n=1 to 4, wherein the maximum height difference $\Delta D$ is represented by expression(1):

$$\Delta D = \text{Max } \{H_{max}(C_n)-H_{min}(M_1), H_{max}(C_n)-H_{min}(M_2), H_{max}(M_1)-H_{min}(C_n), H_{max}(M_2)-H_{min}(C_n)\} \quad \text{expression (1)}$$

wherein $\text{Max}\{x_1, x_2, x_3, x_4\}$ means the maximum value among $x_1$ to $x_4$, and (vi) the frame-shaped region includes at least one whole contour line therein, and wherein a contour line present in the frame-shaped region has an approximately square shape in which a space between sides opposite to each other is 132 mm to 148 mm.

4. The mask blank according to claim 3, wherein the first main surface has a square shape in which each side has a length $L_1$ of 152 mm.

5. The mask blank according to claim 3, wherein the layer for circuit pattern comprises a light-shielding film which shields light.

6. The mask blank according to claim 4, wherein the layer for circuit pattern comprises a light-shielding film which shields light.

7. The mask blank according to claim 3, wherein the layer for circuit pattern comprises: a light absorbing film which absorbs light; and a reflective film which reflects the light and which is disposed between the absorbing film and the substrate.

8. The mask blank according to claim 4, wherein the layer for circuit pattern comprises: a light absorbing film which absorbs light; and a reflective film which reflects the light and which is disposed between the absorbing film and the substrate.

9. The mask blank according to claim 3, wherein the layer for circuit pattern comprises:
a low-reflection film;
an absorbing film which absorbs light and which is disposed between the low reflection film and the second main surface; and
a reflective film which reflects the light and which is disposed between the absorbing film and the second main surface,
wherein a reflectivity of light for inspection of circuit patterns of the low-reflection film is lower than a reflectivity of light for inspection of circuit patterns of the absorbing film.

10. The mask blank according to claim 4, wherein the layer for circuit pattern comprises;
a low-reflection film;
an absorbing film which absorbs light and which is disposed between the low reflection film and the second main surface; and
a reflective film which reflects the light and which is disposed between the absorbing film and the second main surface,
wherein a reflectivity of light for inspection of circuit patterns of the low-reflection film is lower than a reflectivity of light for inspection of circuit patterns of the absorbing film.

11. The mask blank according to claim 7, comprising a conductive film on the first main surface.

12. The mask blank according to claim 8, comprising a conductive film on the first main surface.

13. The mask blank according to claim 9, comprising a conductive film on the first main surface.

14. The mask blank according to claim 10, comprising a conductive film on the first main surface.

* * * * *